US008361837B2

(12) United States Patent
Cui et al.

(10) Patent No.: US 8,361,837 B2
(45) Date of Patent: Jan. 29, 2013

(54) MULTIPLE INTEGRATED CIRCUIT DIE PACKAGE WITH THERMAL PERFORMANCE

(75) Inventors: Cheng Qiang Cui, Singapore (SG); Chee Wah Cheung, Wai Chai (HK)

(73) Assignee: Compass Technology Co. Ltd., Shatin (HK)

( * ) Notice: Subject to any disclaimer, the term of this patent is extended or adjusted under 35 U.S.C. 154(b) by 147 days.

(21) Appl. No.: 12/932,724

(22) Filed: Mar. 4, 2011

(65) Prior Publication Data

US 2011/0159640 A1 Jun. 30, 2011

Related U.S. Application Data (62) Division of application No. 11/527,298, filed on Sep. 26, 2006, now Pat. No. 7,906,844.

(51) Int. Cl.
*H01L 21/98* (2006.01)
(52) U.S. Cl. .. 438/109; 438/715; 257/686; 257/E25.013
(58) Field of Classification Search .................. 438/109, 438/715, 107, 122, 121; 257/686, E25.013, 257/705, 777, 706, 699
See application file for complete search history.

(56) References Cited

U.S. PATENT DOCUMENTS

| 5,866,943 | A | 2/1999 | Mertol |
| 6,447,321 | B1 | 9/2002 | Perino et al. |
| 6,472,741 | B1* | 10/2002 | Chen et al. ................... 257/712 |
| 6,483,187 | B1 | 11/2002 | Chao et al. |
| 6,798,057 | B2 | 9/2004 | Bolkin et al. |
| 6,818,978 | B1* | 11/2004 | Fan .............................. 257/686 |
| 6,919,631 | B1* | 7/2005 | Hoffman et al. .............. 257/707 |
| 7,038,312 | B2 | 5/2006 | Khan et al. |
| 7,411,281 | B2 | 8/2008 | Zhang |
| 7,482,686 | B2 | 1/2009 | Zhao et al. |
| 7,786,591 | B2 | 8/2010 | Khan et al. |
| 2006/0172457 | A1* | 8/2006 | Huang ......................... 438/106 |

* cited by examiner

*Primary Examiner* — S. V. Clark
*Assistant Examiner* — Krista Soderholm
(74) *Attorney, Agent, or Firm* — Saile Ackerman LLC; Stephen B. Ackerman; Rosemary L. S. Pike (57) ABSTRACT

A method of assembling a multi-die package is achieved. A heat spreader is disposed on a printed circuit substrate. At least one integrated circuit die is disposed on a top side of the heat spreader and at least one other integrated circuit die is disposed on a bottom side of the heat spreader wherein the dies are connected to the substrate by wire bonds. Thermal solder balls are electrically connected to solderable pads of the heat spreader through the open holes of the substrate, so as to couple the heat spreader to function as a ground plane. Some of the ground pads of the dies can be bonded onto the heat spreader and the others bonded onto the substrate. Alternatively, all of the dies could only be connected to the substrate by wire bonding, and not connected to the heat spreader.

32 Claims, 6 Drawing Sheets

MULTIPLE INTEGRATED CIRCUIT DIE PACKAGE WITH THERMAL PERFORMANCE

This is a divisional application of U.S. patent application Ser. No. 11/527,298 filed on Sep. 26, 2006 now U.S. Pat. No. 7,906,844 which is herein incorporated by reference in its entirety.

BACKGROUND OF THE INVENTION (1) Field of the Invention

The invention relates to processes for packaging multiple integrated circuit dies, and more particularly, to a method of packaging multiple integrated circuit dies on both sides of an interposer.

(2) Description of the Related Art

Integrated circuit (IC) chips have been increasing in size and function to meet the demand for the manufacture of electronic products with smaller size, lighter weight, thinner profile and low cost along with high thermal and electrical performance. To accommodate these chips in IC packaging for miniaturization, the trend of package development is moving toward stack-up dies in 3 dimensions.

U.S. Patent Application 2005/0280139 (Zhao et al) discloses a die-up array where a die is attached to one side of a stiffener and a heat slug is attached to the other side of the stiffener. U.S. Pat. No. 6,798,057 (Bolkin et al) shows a ball grid array (BGA) package having dies coupled to both sides of an interposer. Sets of two dies coupled on either side of an interposer can be stacked and interconnected using interface balls. U.S. Pat. No. 7,038,312 (Khan et al) shows a die-up package on a heat spreader or stiffener. U.S. Pat. No. 6,483,187 (Chao et al) discloses a grounded heat spreader with a substrate thereover and a die within the cavity. No stack-up dies are disclosed or suggested.

U.S. Pat. No. 6,447,321 (Perino et al) shows an IC epoxied to a base that acts as a heat spreader and is a ground plane. An IC can be within a cavity in the base. U.S. Pat. No. 5,866,943 (Mertol) describes an IC within a cavity formed by a heat spreader and a stiffener. The IC is attached to a substrate via solder balls. U.S. Patent Application 2005/0280141 (Zhang) shows a die-down package where an IC is in a cavity of a heat spreader. The IC is wire bonded to a substrate attached to the heat spreader and is further attached to an interposer via solder balls.

SUMMARY OF THE INVENTION

A principal object of the present invention is to provide a cost-effective and very manufacturable method of packaging IC dies.

A further object of the invention is to provide a method of packaging more than two IC dies.

Another object is to provide a method of packaging at least two IC dies for optimum thermal performance.

Yet another object of the invention is to provide a multi-die package having optimum thermal performance.

According to the objects of the invention, a method of assembling a multi-die package is achieved. A heat spreader is disposed on a printed circuit substrate. At least one integrated circuit die is disposed on a top side of the heat spreader and at least one other integrated circuit die is disposed on a bottom side of the heat spreader wherein the dies are connected to the substrate by wire bonds.

Thermal solder balls are electrically connected to solderable pads of the heat spreader through the open holes of the substrate, so as to couple the heat spreader to function as a ground plane. Some of the ground pads of the dies can be bonded onto the heat spreader and the others bonded onto the substrate. Alternatively, all of the dies could only be connected to the substrate by wire bonding, and not connected to the heat spreader.

Also according to the objects of the invention, a multi-die package is achieved. The multi-die package comprises a heat spreader disposed on a printed circuit substrate, at least one integrated circuit die disposed on a top side of the heat spreader and at least one other integrated circuit die disposed on a bottom side of the heat spreader wherein the dies are connected to the substrate by wire bonds.

BRIEF DESCRIPTION OF THE DRAWINGS

In the accompanying drawings forming a material part of this description, there is shown.

DESCRIPTION OF THE PREFERRED EMBODIMENTS

In the present invention, at least two IC dies are packaged with the support of a heat spreader and interconnected to a printed circuit substrate with wire bonding. The heat spreader provides power dissipation as well as functioning as a ground plane. The package structure of multiple integrated circuit (IC) dies is assembled on both surfaces of a heat spreader and wire bonded onto both surfaces of a printed circuit substrate.

The first die is disposed on a first surface of a heat spreader and is electrically connected by wire bonding through the open slot of the heat spreader to the first surface of the substrate. The second die sits in a cavity on the second surface of the heat spreader wherein there is an opening in the substrate underlying the cavity. The second die is electrically connected by wire bonding onto the second surface of the substrate. Solder balls are attached on the second surface of the substrate for subsequent connection to a second level printed circuit board, not shown. More dies could be stacked on the first and second dies in the package. The heat spreader can also be finished with Ag, Ni/Au, or Ni/Pd for wire bonding electrically connected from the dies.

Thermal solder balls are electrically connected to the solderable pads of the heat spreader through the open holes of the substrate, so as to couple the heat spreader to function as a ground plane. The thermal solder balls are electrically connected to the solderable pads of the heat spreader and the ground leads of the substrate through the plated through-hole (PTH) of the latter. Some of the ground pads of the dies can be bonded onto the heat spreader, and the others bonded onto the substrate, based on design optimization. Alternatively, all of the dies could only be connected to the substrate by wire bonding, and not connected to the heat spreader. In the disclosure, the heat spreader also functions as a ground plane. The grounded heat spreader can be achieved either with or without wire bonding on the heat spreader from the dies.

According to the present invention, the first die in the cavity of the heat spreader is normally not larger than the second die on the first surface of the heat spreader. For multiple dies more than two dies, the dies in the cavity face down, while the dies on the first surface of the heat spreader face up. Dies are attached to one another by die attach adhesive or bonding film. The multi-die package could be encapsulated with glue-top dispensing, printing or transfer molding. The substrate used in the packages could be a polyimide-based flexible tape, a semi-flexible epoxy-based substrate, or a laminated rigid printed circuit substrate containing a two-metal conductor layer (2-ML), or multi-metal conductor layer with more than 2 layers. The heat spreader could be made of aluminum or copper and their alloys or other composite materials or ceramic materials with good thermal conductivity. Dies are all attached to one side of the heat spreader and encapsulated before other dies are attached to the second side of the heat spreader and encapsulated.

The process of the invention will be further described with reference to the drawing figures. It will be understood by those skilled in the art that the invention is not limited to the examples shown in the figures. Variations can be made by those skilled in the art without departing from the scope and spirit of the invention.

Figure 1:
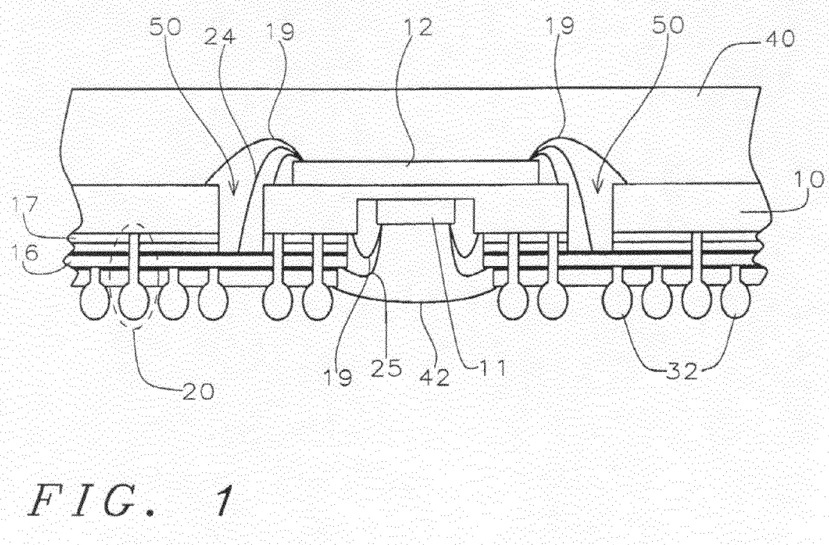
FIG. 1 schematically illustrates in cross-sectional representation a first preferred embodiment of the present invention.
Figure 3A:
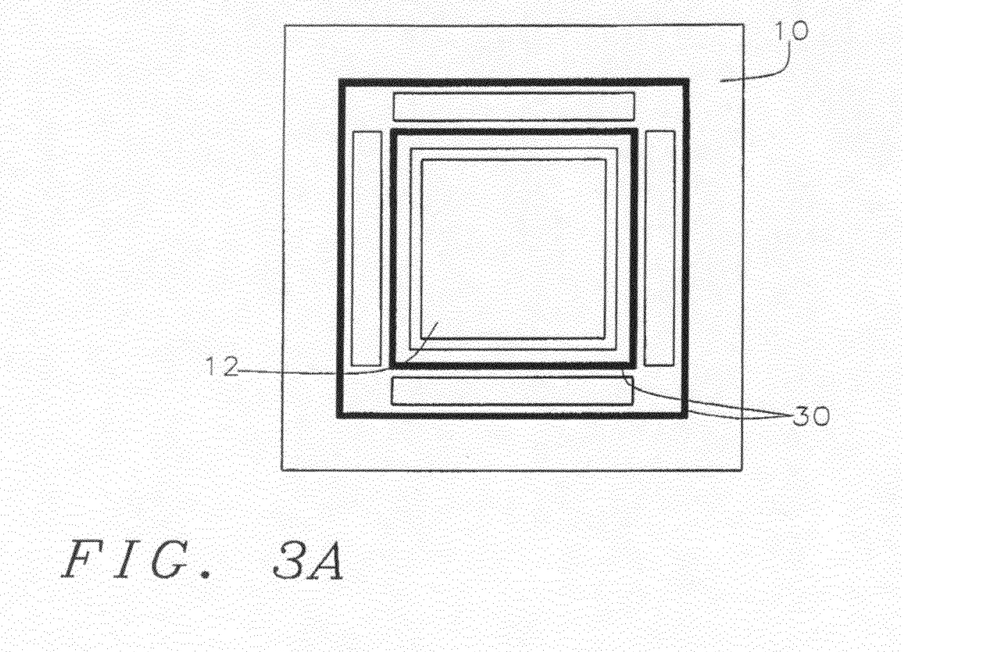
FIGS. 3A and 3B schematically illustrate a top view and a bottom view, respectively, of FIG. 1.
Figure 3B:
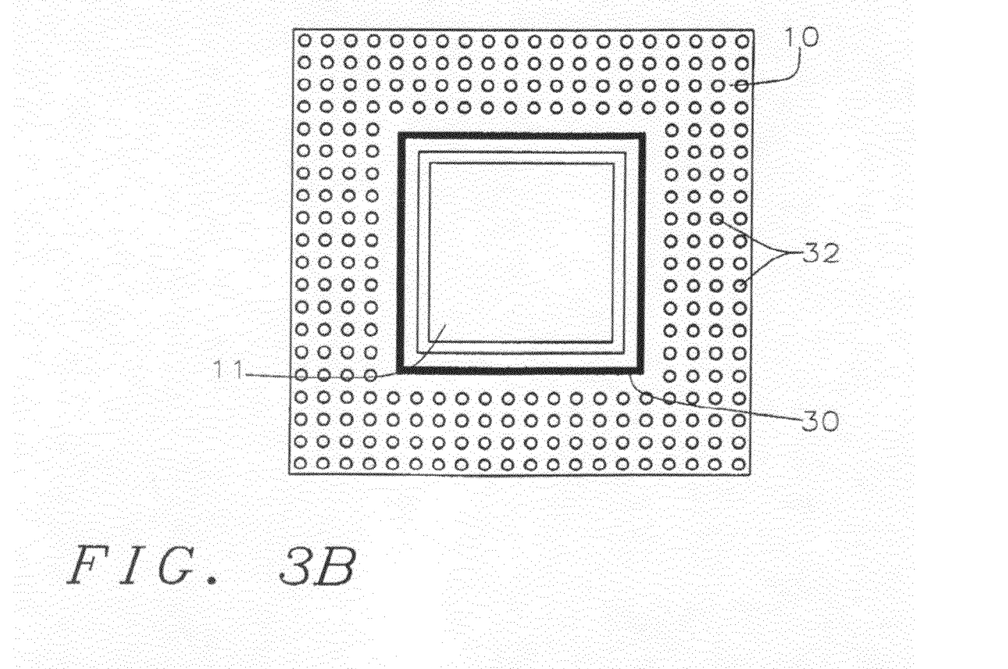

FIG. 1 illustrates a first preferred embodiment of the invention showing a multi-die package with grounded heat spreader 10. The thermal solder ball attachment structure 20 also provides the ground connection to the heat spreader. FIG. 3A shows a top view of the package and FIG. 3B shows a bottom view of the package. Die 11 is attached to the bottom surface of the heat spreader within the cavity, as shown in FIG. 3B. Die 12 is attached to the top surface of the heat spreader as shown in FIG. 3A. Dies are attached to the heat spreader using conventional die attach adhesive or bonding films.

The die 12 is electrically connected by wire bonding 24 through the open slot of the heat spreader to the first surface of the substrate 16. The die 11 is electrically connected by wire bonding 25 to the second surface of the substrate. The ground pads of dies 11 and 12 are wire bonded 19 to the heat spreader. FIGS. 3A and 3B show the wire bond rings 30, finished with Ag, Ni/Au, or Ni/Pd, on the heat spreader. FIG. 3B shows BGA balls 32.

Solder balls 32 are formed on the bottom surface of the substrate. Some of these balls are thermal balls 20, directly attached to the heat spreader through the open holes or plated through holes of the substrate 16 to couple the heat spreader as a ground plane. Substrate 16 may be a two-metal layer or multi-metal layer substrate. In this embodiment, the heat spreader is grounded by the wire bonding from the die and also by coupling of the thermal balls to the heat spreader. Sometimes, wire bonding on the heat spreader is desirable when too many wires are needed for bonding. Wire bonding on the heat spreader could reduce one row of wire bonding to the substrate.

Figure 2A:
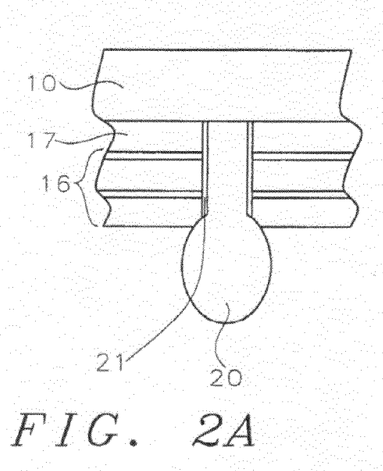
FIGS. 2A and 2B schematically illustrate in cross-sectional representation enlarged views of two alternative structures in FIG. 1.
Figure 2B:
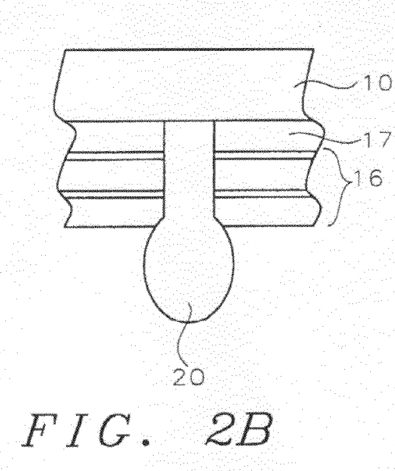

FIG. 2A shows a plated through hole and FIG. 2B shows an open hole. In FIG. 2A, the thermal solder ball 20 is connected to the heat spreader through the sidewall of the plated through hole and the clearance of the hole. In FIG. 2B, the thermal solder ball 20 is connected to the heat spreader only through the clearance of the hole which is not a plated through hole. That is, the plated through-hole has copper conductor 21 on the sidewall of the hole. The open hole has no copper conductor on the sidewall of the hole.

A metal finish such as silver or Ni/Au may be deposited on the wire bonding rings 30 for wire bonding. Ball pads for thermal solder ball attachment are applied on the bottom surface of the heat spreader. The ball pads may be finished with flash silver, tin, solder or Ni/flash Au for solderability of the thermal solder balls.

Figure 4A:
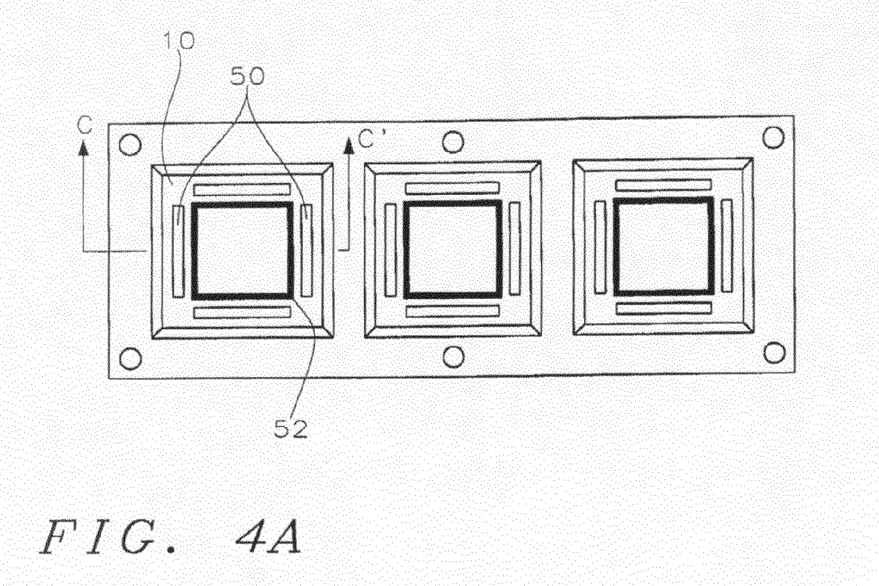
FIGS. 4A and 4B schematically illustrate a top view and a bottom view, respectively, of a portion of FIG. 1.
Figure 4B:
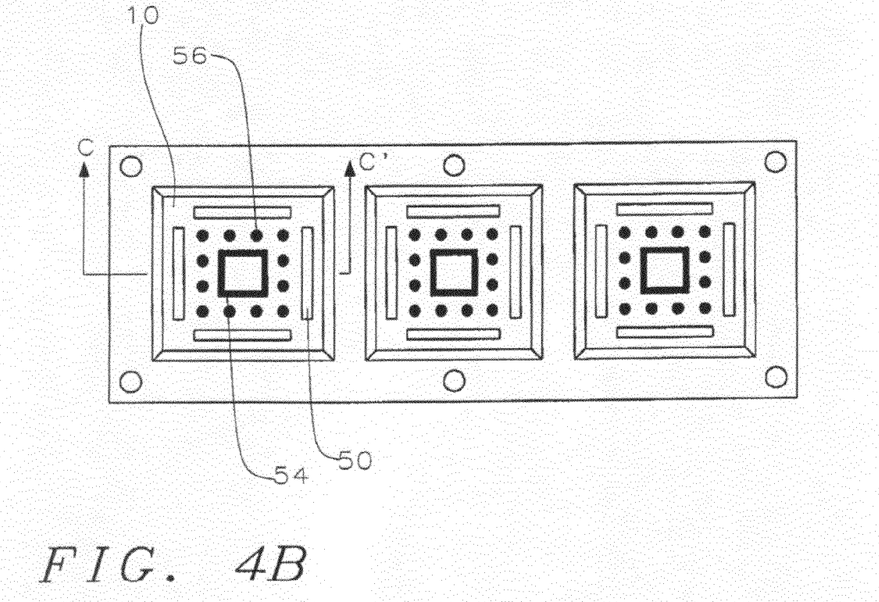

FIG. 4A shows the top side and FIG. 4B shows the bottom side of the heat spreader. The heat spreader has a thickness of between about 0.125 and 2.0 mm and has a cavity and slot openings, as shown, fabricated by chemical etching or mechanical stamping. The heat spreader is treated with organic solder preservative (OSP), brown oxide or black oxide for good adhesion of an adhesive for substrate attachment. The substrate is attached to the bottom side of the heat spreader preferably by a thermo-set adhesive having a preferred thickness of between about 0.025 to 0.10 mm.

FIGS. 4A and 4B show the strip format of the heat spreader for the fabrication of the package. FIG. 1 shows the package which uses one heat spreader; that is, view C-C' of FIGS. 4A and 4B. FIGS. 4A and 4B show, for example, three heat spreaders in the assembly process. FIGS. 4A and 4B show slots 50 through the heat spreader. The metal finish such as silver, Ni/Au, or Ni/Pd for the wire bonding is shown by 52 and 54 and for thermal ball attachment is shown by 56.

Encapsulation 40 is shown on the first surface of the heat spreader and encapsulation 42 is shown on the second surface in FIG. 1.

Figure 5:
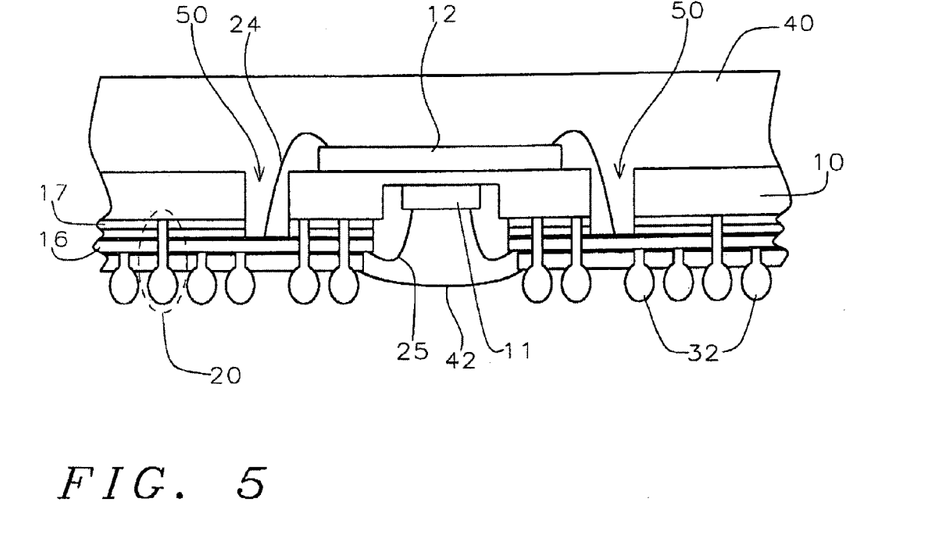
FIG. 5 schematically illustrates in cross-sectional representation a second preferred embodiment of the present invention.
Figures 6A, 6B:
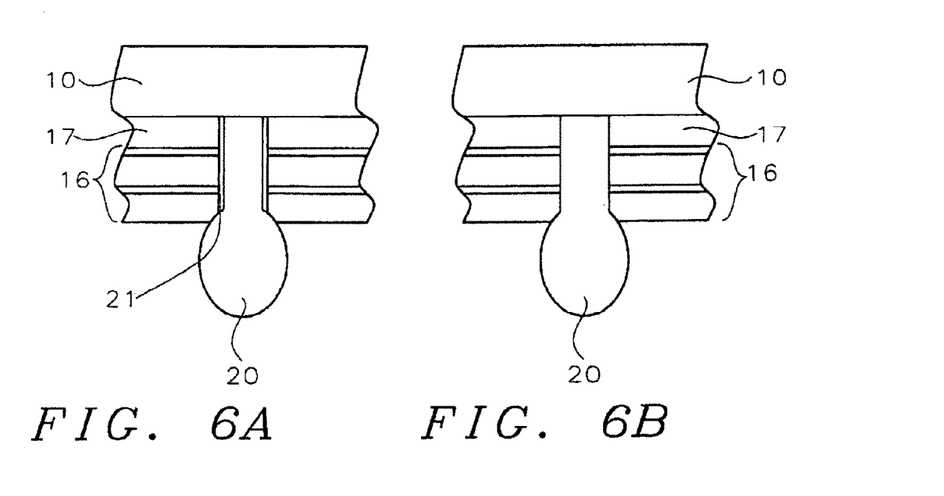
FIGS. 6A and 6B schematically illustrate in cross-sectional representation enlarged views of two alternative structures in FIG. 5.
Figure 7A:
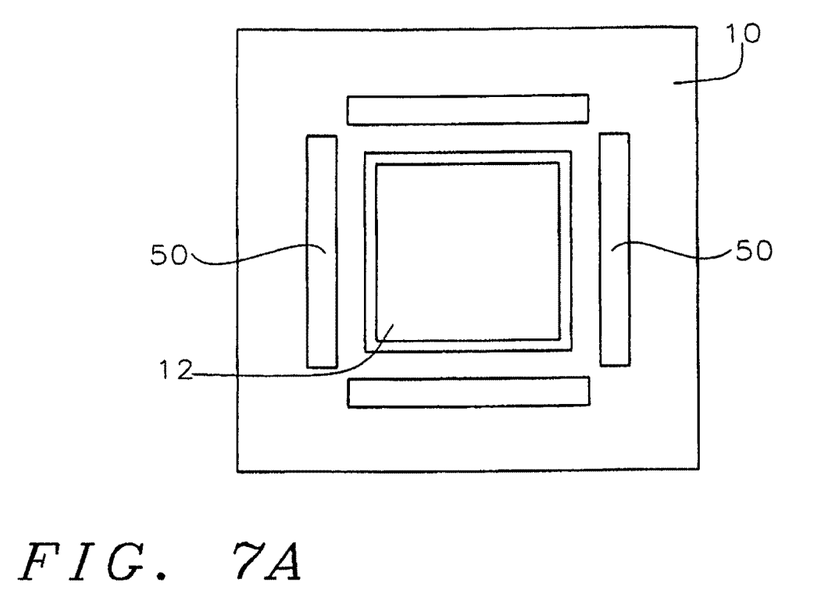
FIGS. 7A and 7B schematically illustrate a top view and a bottom view, respectively, of FIG. 5.
Figure 7B:
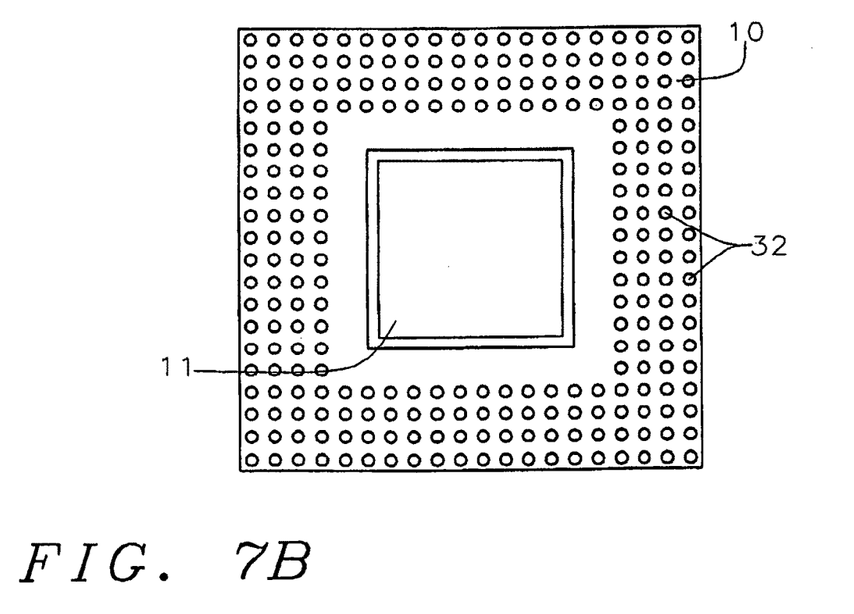

A second preferred embodiment is shown in FIG. 5. FIG. 7A shows the die 12 attached to the top surface of the heat spreader in FIG. 5. FIG. 7B shows die 11 attached to the bottom surface of the heat spreader within the cavity. In this embodiment, the heat spreader is coupled as a ground plane without wire bonding on the heat spreader. All of the wires 24, 25 are bonded on the substrate 16 including the ground pads of the dies. The thermal balls 20 are directly attached on the heat spreader through the open holes or plated through-holes (PTH) of the substrate which are connected to the ground leads as shown in FIG. 5, leading the heat spreader to function as a ground plane. As a result, not a wire bondable metal finish, but a solderable metal finish is required on the heat spreader. The solderable metal finish on the heat spreader could be flash Ag, OSP, Sn or solder, etc. This is a simpler requirement for the metal finish on the heat spreader, thus reducing costs. No wirebonding is performed to the heat spreader in this embodiment.

Figure 8:
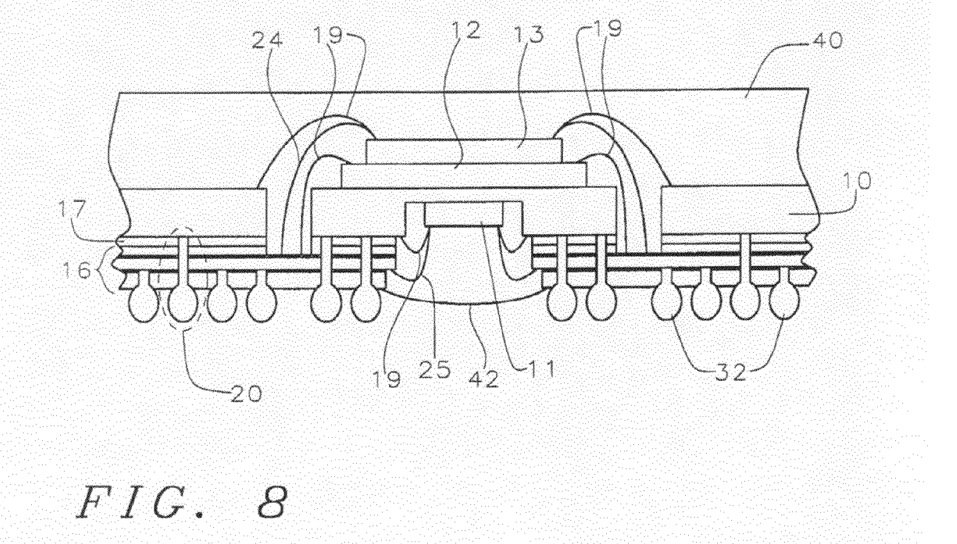
FIGS. 8 and 9 schematically illustrate in cross-sectional representation examples of other embodiments of the present invention.
Figure 9:
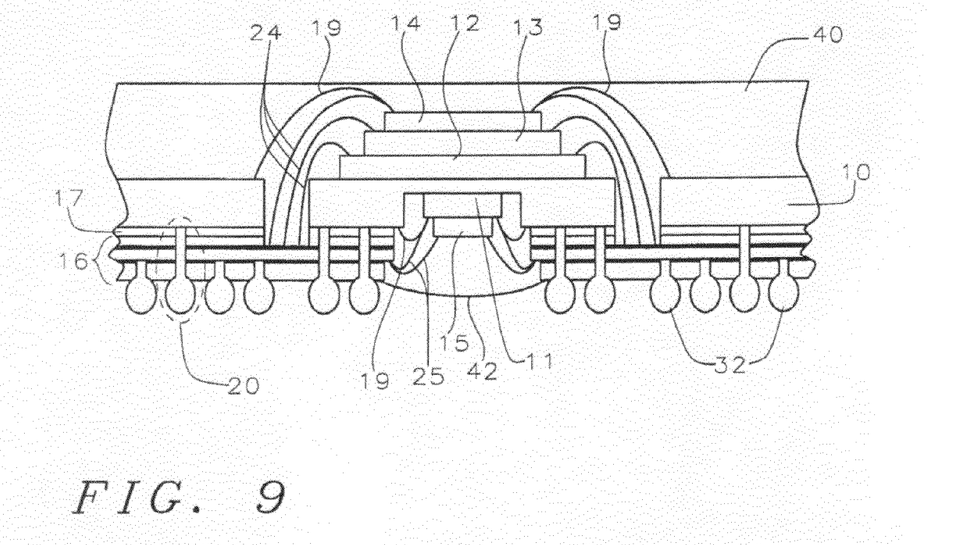

More than two dies can be packaged in the disclosed package structure. Extra dies would be stacked on either the top side or the bottom side, or both sides of the heat spreader. In FIGS. 8 and 9, three and five dies are packaged in the structure, respectively. In FIG. 8, dies 12 and 13 are stacked on the top surface and die 11 is on the bottom surface of the heat spreader. In FIG. 9, dies 12, 13, and 14 are stacked on the top surface of the heat spreader and dies 11 and 15 are stacked on the bottom surface. More dies can also be stacked on either the top or the bottom side. Stacking is accomplished by using a die attach adhesive or bonding films, as conventional.

Encapsulation of the dies on each side of the heat spreader comprises glue-top dispensing encapsulation, printing encapsulation, or transfer molding. Encapsulation of the completed stack of dies on one side of the heat spreader is performed before the stacking of dies on the other side of the heat spreader.

The present invention provides a method for stacking two or more IC dies in a package using a heat spreader as a grounded base on a substrate. The dies are stacked on both sides of the heat spreader. The multi-die package of the invention achieves high thermal performance.

While the invention has been particularly shown and described with reference to the preferred embodiments thereof, it will be understood by those skilled in the art that various changes in form and details may be made without departing from the spirit and scope of the invention.

What is claimed is:

1. A method of assembling a multi-die package comprising:
    providing a heat spreader disposed on a printed circuit substrate wherein said heat spreader has a cavity on its bottom side and wherein there is an opening in said substrate underlying said cavity;
    disposing at least one first integrated circuit die on a top side of said heat spreader;
    disposing at least one other second integrated circuit die on a bottom side of said heat spreader within said cavity;
    connecting said first die to a top surface of said substrate by wire bonds; and
    and connecting said second die to a bottom surface of said substrate by wire bonds.

2. The method according to claim 1 further comprising encapsulating said top side of said package and encapsulating said bottom side of said package wherein said encapsulating comprises glue-top dispensing encapsulation, printing encapsulation, or transfer molding.

3. The method according to claim 1 further comprising attaching solder balls on said bottom surface of said substrate for surface mounting a second printed circuit board.

4. The method according to claim 1 wherein said at least one die disposed on said bottom side of said heat spreader sits in said cavity of said heat spreader, wherein said top surface of said substrate is attached to said bottom side of said heat spreader.

5. The method according to claim 1 further comprising stacking one or more additional integrated circuit dies on said at least one integrated circuit die disposed on said top side of said heat spreader or on said at least one integrated circuit die disposed on said bottom side of said heat spreader or on both said integrated circuit dies disposed on top and bottom sides of said heat spreader.

6. The method according to claim 5 wherein all of said stacking on one side of said heat spreader is completed before said stacking on another side of said heat spreader is begun.

7. The method according to claim 1 wherein said connecting said integrated circuit die on said top side of said heat spreader to said substrate is by wire bonding through slot openings in said heat spreader.

8. The method according to claim 1 further comprising wire bonding ground pads of said dies to said heat spreader.

9. The method according to claim 1 further comprising directly connecting thermal solder balls to said heat spreader through open holes or plated through-holes of said substrate whereby said heat spreader functions as a ground plane.

10. The method according to claim 9 wherein ground pads of said dies are wire bonded to said substrate and are not wire bonded to said heat spreader and wherein ground leads of said substrate are linked to said thermal solder balls.

11. The method according to claim 1 wherein said heat spreader comprises metals such as Cu or Al or their alloys or ceramic or organic composite materials with good thermal conductivity.

12. The method according to claim 7 wherein said heat spreader has a thickness of 0.125 to 2.0 mm and further comprising forming said cavity and slot openings in said heat spreader by chemical etching or mechanical stamping.

13. The method according to claim 1 further comprising:
    treating said heat spreader with organic solder preservative (OSP), brown oxide or black oxide; and
    thereafter attaching said substrate to said heat spreader using a thermo-set adhesive film having a thickness of 0.025 to 0.1 mm.

14. The method according to claim 13 further comprising finishing wire bonding ground rings and solderable pads on said heat spreader with silver or Ni/soft Au or Ni/Pd for wire bondability and solderability.

15. The method according to claim 14 further comprising finishing portions of said heat spreader where said thermal solder balls are connected with flash silver, tin, solder or Ni/flash Au for solderability of said thermal solder balls.

16. The method according to claim 1 wherein said printed circuit substrate comprises a flexible polyimide tape substrate, a semi-flexible epoxy-based substrate, or a laminated rigid substrate.

17. The method according to claim 1 wherein said printed circuit substrate comprises a two-metal conductor layer, or a multi-metal conductor layer with more than two metal layers.

18. A method of assembling a multi-die package comprising:
    providing a heat spreader disposed on a printed circuit substrate wherein said heat spreader has a cavity on its bottom side and wherein there is an opening in said substrate underlying said cavity;
    disposing at least one first integrated circuit die on a top side of said heat spreader;
    disposing at least one other second integrated circuit die on a bottom side of said heat spreader wherein said dies are connected to said substrate by wire bonds;
    connecting said first die to a top surface of said substrate by wire bonds;
    connecting said second die to a bottom surface of said substrate by wire bonds;
    attaching thermal solder balls on a bottom surface of said substrate; and
    electrically connecting said thermal solder balls to said heat spreader through open holes in said substrate.

19. The method according to claim 18 further comprising encapsulating said top side of said package and encapsulating said bottom side of said package wherein said encapsulating comprises glue-top dispensing encapsulation, printing encapsulation, or transfer molding.

20. The method according to claim 18 wherein said at least one die disposed on said bottom side of said heat spreader sits in said cavity of said heat spreader, wherein said top surface of said substrate is attached to said bottom side of said heat spreader.

21. The method according to claim 18 further comprising stacking one or more additional integrated circuit dies on said at least one first integrated circuit die disposed on said top side of said heat spreader or on said at least one second integrated circuit die disposed on said bottom side of said heat spreader or on both said integrated circuit dies disposed on top and bottom sides of said heat spreader.

22. The method according to claim 21 wherein all of said stacking on one side of said heat spreader is completed before said stacking on another side of said heat spreader is begun.

23. The method according to claim 22 wherein said connecting said integrated circuit die on said top side of said heat spreader to said substrate is by wire bonding through an slot openings in said heat spreader.

24. The method according to claim 18 further comprising wire bonding ground pads of said dies to said heat spreader.

25. The method according to claim 18 wherein ground pads of said dies are wire bonded to said substrate and are not wire bonded to said heat spreader and wherein ground leads of said substrate are linked to said thermal balls.

26. The method according to claim 18 wherein said heat spreader comprises metals such as Cu or Al or their alloys or ceramic or organic composite materials with good thermal conductivity.

27. The method according to claim 23 wherein said heat spreader has a thickness of 0.125 to 2.0 mm and further comprising forming said cavity and slot openings in said heat spreader by chemical etching or mechanical stamping.

28. The method according to claim 18 further comprising:
treating said heat spreader with organic solder preservative (OSP), brown oxide or black oxide; and
thereafter attaching said substrate to said heat spreader using a thermo-set adhesive film having a thickness of 0.025 to 0.1 mm.

29. The method according to claim 18 further comprising finishing wire bonding ground rings and solderable pads on said heat spreader with silver or Ni/soft Au or Ni/Pd for wire bondability and solderability.

30. The method according to claim 18 further comprising finishing portions of said heat spreader where said thermal solder balls are connected with flash silver, tin, solder or Ni/flash Au for solderability of said thermal solder balls.

31. The method according to claim 18 wherein said printed circuit substrate comprises a flexible polyimide tape substrate, a semi-flexible epoxy-based substrate, or a laminated rigid substrate.

32. The method according to claim 18 wherein said printed circuit substrate comprises a two-metal conductor layer, or a multi-metal conductor layer with more than two metal layers.

* * * * *